United States Patent [19]

Kampe et al.

[11] 3,956,092

[45] May 11, 1976

[54] METHOD OF MAKING MEASURING ELEMENTS SUCH AS GAUGE BLOCKS

[75] Inventors: Anders Kampe, Eskilstuna; Olof Vingsbo, Uppsala, both of Sweden

[73] Assignee: Aktiebolaget C. E. Johansson, Eskilstuna, Sweden

[22] Filed: May 2, 1974

[21] Appl. No.: 466,315

Related U.S. Application Data

[63] Continuation-in-part of Ser. No. 224,588, Feb. 8, 1972, abandoned.

[30] Foreign Application Priority Data

Feb. 19, 1971 Sweden............................. 2133/71
Feb. 2, 1972 Sweden............................. 1171/72

[52] U.S. Cl.............................. 204/192; 33/168 R; 33/174 H
[51] Int. Cl.²..................... C23C 15/00; G01B 3/30
[58] Field of Search.................. 204/192, 38 C; 33/168 R, 174 H; 117/53, 129

[56] References Cited
UNITED STATES PATENTS

| | | | |
|---|---|---|---|
| 1,887,372 | 11/1932 | Emmons | 33/168 R |
| 2,772,483 | 12/1956 | Gierlich | 33/168 R |
| 3,121,643 | 2/1964 | Eisenberg | 117/129 X |
| 3,655,544 | 4/1972 | Rairden | 204/192 |
| 3,709,809 | 1/1973 | Wright et al. | 204/192 |

FOREIGN PATENTS OR APPLICATIONS 1,954,853   5/1971   Germany ........................... 204/192

OTHER PUBLICATIONS

Berry et al., "Thin Film Technology," Van Nostrand Reinhold (1968), pp. 198, 199, 214.

Primary Examiner—T. Jung
Assistant Examiner—Aaron Weisstuch
Attorney, Agent, or Firm—Pollock, Vande Sande & Priddy

[57] ABSTRACT

A method for the preparation of very accurate measuring surfaces on measuring elements such as gauge blocks, surface plates, and the like. In one embodiment of the inventive method, the measuring surface is prelapped to a level of two to five microns below the desired final level. Thereafter, the surface is sputter coated with a hard ceramic or cermet layer with a thickness of three to ten microns, and finally the surface is lapped until the final desired level is reached. The invention also comprehends measuring elements made according to the novel method.

8 Claims, No Drawings

METHOD OF MAKING MEASURING ELEMENTS SUCH AS GAUGE BLOCKS

This is a continuation-in-part application of Ser. No. 224,588 filed Feb. 8, 1972 and now abandoned.

BACKGROUND OF THE INVENTION

This invention relates to improvements in the method of manufacturing measuring surfaces on measuring elements, particularly combination gauge blocks, surface plates, and the like.

Measuring surfaces such as are used on combination gauge blocks, surface plates, measuring tables, and measuring tips, must be extremely accurately formed if they are to provide their intended function. In many instances, it is required that the profile depth not exceed the order of 0.02 microns.

In the manufacturing process, measuring elements, such as steel combination gauge blocks, are susceptible to scratching, and thus there is a tendency that only some of the resulting measuring surfaces will have received sufficient smoothness while others are scratched so that they must be rejected or graded down to lower quality levels. By means of the present invention, however, it is possible to recover such rejected workpieces, at the same time imparting to them a much higher degree of scratch resistance. The method of the invention is applicable not only to the reworking of surfaces which have been rejected because of scratches, but it also is intended to be used as a preferred method in the making of measuring surfaces generally.

In many instances, such objects having measuring surfaces are made of hardened steel. To meet the demands regarding profile depth and exceedingly small dimensional tolerances, as well as to provide a high degree of flatness during the final working of said measuring surfaces, the procedure of lapping us used. Incidentally, "lapping" as used herein denotes an operation which is performed with abrasive between the workpiece and a rigid supporting means such as a cast iron disc, for example, and is to be distinguished from a polishing operation which is performed with an abrasive between the workpiece and a resilient supporting means such as felt or rasp. In general, a polishing operation is not satisfactory since the resiliency of the supporting surface is not conducive to obtaining the high degree of flatness required. In any event, in the lapping operation, an abrasive material which may comprise a finely grained powder of a hard, ceramic material such as aluminum oxide, silicon carbide, or diamond, is used. In the lapping operation, various conditions affect the smoothness of the final gauge surface such as the surface pressure, the lubricant, the difference in hardness between the workpiece and the working material, and unless all of these are at optimum conditions, scratching of the gauge surface may result, In some instances, as much as 60 percent of the measuring surfaces must be rejected or graded down to lower quality levels.

Attempts have been made to avoid some of the disadvantages referred to above by making the workpieces entirely of ceramic or cermet materials as, for example, hard carbides such as tungsten carbide or chromium carbide. The use of such materials has made it possible to avoid scratches; however, such materials have a significant disadvantage in that their coefficient of linear thermal expansion differs markedly from that of steel. Since measuring elements such as combination gauge blocks generally are used in the measurement of objects made of steel, and since it must be assumed that such measurements are carried out at different ambient temperatures, it is vital that the coefficient of linear thermal expansion of the material of the measuring element be substantially the same as that of steel.

SUMMARY OF THE INVENTION

If a measuring surface of a measuring element such as a combination gauge block is coated with a comparatively thin ceramic or cermet layer of one or more carbides, nitrides, and/or borides of metals belonging to the groups numbered 3 to 6 of the Periodic Table, particularly titanium or tungsten carbide, it is possible to avoid scratching of the measuring surface during the final working operation comprising a lapping operation, other conditions being unchanged. This makes possible the use of steel as the principal material of the measuring element, thereby providing the advantage mentioned above that the coefficient of linear thermal expansion of the measuring element is then the same as that of the material being measured.

In practicing the method of the invention, it has been proved to be very advantageous, according to one embodiment, to prelap the measuring surface to a level of 2 to 5 microns below the desired final measure prior to the step of coating the surface with a ceramic or cermet layer. The prelapped surface is then coated with a hard ceramic or cermet layer of, for example, titanium carbide to a thickness which is from 3 to 10 microns thick so that the thus-coated surface slightly exceeds the desired final measure. Finally, the ceramic or cermet layer thus applied is lapped until the final dimension of the surface is obtained.

Preferably the coating of the hard ceramic or cermet layer on the prelapped surface is carried out by sputtering under such conditions that the measuring element is maintained at a temperature below 150°C. Such sputtering is achieved by ionic bombardment, in a radio frequency field, of a target which is formed of the material intended for the final thin layer of ceramic or cermet material. The sputtering takes place in an argon plasma at a low pressure such as $10^{-3} - 10^{-2}$ torr. Particles of the ceramic or cermet material are emitted from the target and stream to the substrate comprising the measuring element, and such ionic bombardment is continued until the desired thickness of the ceramic or cermet layer is obtained. In order to ensure that the measuring element does not reach too high a temperature, the arrangement for the sputtering is such that the target is located inside the vacuum chamber near the top thereof, and the measuring element or elements are placed on a fluid-cooled support means near the bottom of the chamber, such support means comprising, for example, a water-cooled copper block. The temperature of the measuring element, such as the gauge block, is purposely maintained at a relatively low value, preferably not in excess of 150°C in order to prevent warping and other large changes in dimension of the workpiece which are not tolerable in the case of precision gauge blocks or the like.

In accordance with a modification of the method of the invention, the measuring surface on a measuring element such as a steel combination gauge block is first abraded and made micro smooth by grinding or lapping, and such surface is then coated, preferably in the manner suggested above, with a ceramic or cermet layer of a thickness of 0.02 to 3 microns. Such a ceramic or cermet layer has such uniformity and smoothness that a final lapping step is not needed. Such thin ceramic or cermet layer has proved to impart satisfactory properties to the measuring surface with respect to wear resistance during transport as well as corrosion resistance and adhesion between adjoining measuring surfaces (i.e., mutual adhesion of two adjacent blocks after mutual wringing).

It will be appreciated from the above description that an important feature of the invention is the application of a very thin ceramic or cermet layer to the steel material of the measuring surface, such thin layer being necessary because of the drastic difference between the coefficients of thermal expansion of the layer and of the steel material. It will be appreciated that the problems resulting from differences in thermal expansion characteristics of the materials used become significant when, as is commonly done, a plurality of such measuring surfaces such as gauge blocks is assembled in a stack. For example, if five such combination gauge blocks are superimposed, one on top of the other, there will then be ten parallel measuring surfaces, each measuring surface necessarily requiring very close tolerances. Any error resulting from differences in thermal expansion of the metal-ceramic layers may then be magnified ten times in such an instance where five superimposed gauge blocks are employed.

It is known in the prior art to coat a metal with a ceramic layer, using chemical sublimation plating at a temperature of 900°C to 1200°C. Such a method is shown in Ruppert et al. U.S. Pat. No. 2,962,388. However, as is disclosed in such prior art patent, the high operating temperatures there employed cause warping of the metal block as well as changes in the dimensions thereof. In the case of a combination gauge block, the necessity of very close tolerances and the necessity of geometrically plane surfaces clearly make it impossible to employ a method which results in warping of the workpieces. Moreover, repeated heat treatment such as is suggested by Ruppert destroys the planeness of the gauge block by orders of magnitude which are generally visible to the unaided eye. It is for this reason that the present invention teaches that the coating of the gauge block must be carried out at such a low temperature that there will be no appreciable annealing effect and such that no phase transformations such as austenitizing can occur.

It is also apparently known in the art, as disclosed for example in the above-identified Ruppert patent to pretreat a surface prior to coating by polishing. Such prepolishing is, however, inconsistent with the manufacturing of a measuring surface having a high degree of geometrical planeness of the measuring surface. The reason for this is that a polishing operation, as above stated, is performed with an abrasive material between the workpiece and a resilient supporting means such as felt or rasp. The resilient supporting means makes it impossible to provide the necessary degree of planeness. Thus, the method of this invention distinguishes over the prior art by teaching the prelapping of the measuring surface to provide a smooth and geometrically plane surface; the further step of continuing the prelapping operation until the surface is below the desired level; and thereafter sputtering, at a gauge block temperature below 150°C, onto the prelapped surface of a thin ceramic or cermet layer; and finally, according to one embodiment of the invention, performing a final lapping operation to bring the surface down to the desired dimension.

What we claim is:

1. A method for producing a scratch-resistant planar measuring surface on a steel combination gauge block comprising the steps of:
   a. prelapping the measuring surface to provide a smooth and warp-free surface,
   b. continuing the prelapping operation until the surface is about 2 to about 5 microns below the desired level of the intended measuring surface,
   c. applying onto the prelapped surface, by a cathode sputtering process and with the temperature of the prelapped surface being maintained at less than 150° C, a cermet material layer of at least one carbide, nitride or boride of metals belonging to the groups numbered 3 to 6 in the Periodic Table, the cermet layer being applied with a thickness to produce a surface at least at the desired level.

2. The method of claim 1 wherein said cermet is titanium carbide or tungsten carbide.

3. The method of claim 1 wherein the thickness of the cermet material layer is from 3 to 10 microns to provide a surface whose level is above the desired level, and which further includes again lapping the surface until the desired level of the measuring surface is obtained.

4. A method for producing a scratch-resistant planar measuring surface on a steel combination gauge block comprising the steps of:
   a. prelapping the measuring surface to provide a smooth and warp-free surface,
   b. continuing the prelapping operation until the surface is about 2 to about 5 microns below the desired level of the intended measuring surface,
   c. applying onto the prelapped surface, by a cathode sputtering process and with the temperature of the prelapped surface being maintained at less than 150°C, a ceramic material layer with a thickness to produce a surface at least at the desired level.

5. The process of claim 4 wherein the thickness of the ceramic material layer is from 3 to 10 microns to provide a surface whose level is above the desired level, and which further includes again lapping the surface until the desired level of the measuring surface is obtained.

6. A method for producing a scratch-resistant planar measuring surface on a steel combination gauge block comprising the steps of:
   a. prelapping the measuring surface to provide a smooth and warp-free surface,
   b. continuing the prelapping operation until the surface is below the desired level of the intended measuring surface,
   c. applying onto the prelapped surface, by a cathode sputtering process and with the temperature of the prelapped surface being maintained at less than 150° C, a cermet material layer of at least one carbide, nitride or boride of metals belonging to the groups numbered 3 to 6 in the Periodic Table, the cermet layer being applied with a thickness of about 0.02 to about 3 microns to produce a surface at least at the desired level.

7. The method of claim 6 wherein said cermet is titanium carbide or tungsten carbide.

8. A method for producing a scratch-resistant planar measuring surface on a steel combination gauge block comprising the steps of:

a. prelapping the measuring surface to provide a smooth and warp-free surface,
b. continuing the prelapping operation until the surface is below the desired level of the intended measuring surface,
c. applying onto the prelapped surface, by a cathode sputtering process and with the temperature of the prelapped surface being maintained at less than 150° C, ceramic material layer with a thickness of about 0.02 to about 3 microns to produce a surface at least at the desired level.

* * * * *